(12) United States Patent
Oh

(10) Patent No.: US 8,923,072 B2
(45) Date of Patent: Dec. 30, 2014

(54) NON-VOLATILE MEMORY DEVICE AND METHOD OF FABRICATING THE SAME

(71) Applicant: SK Hynix Inc., Gyeonggi-do (KR)

(72) Inventor: Seul-Ki Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 116 days.

(21) Appl. No.: 13/832,793

(22) Filed: Mar. 15, 2013

(65) Prior Publication Data

US 2014/0169105 A1    Jun. 19, 2014

(51) Int. Cl.
*G11C 11/34*      (2006.01)
*G11C 16/14*      (2006.01)
*H01L 27/115*     (2006.01)
*H01L 29/66*      (2006.01)
*H01L 29/792*     (2006.01)

(52) U.S. Cl.
CPC .......... *G11C 16/14* (2013.01); *H01L 27/11551* (2013.01); *H01L 27/11578* (2013.01); *H01L 29/66477* (2013.01); *H01L 29/7926* (2013.01)
USPC ........................ 365/185.29; 257/314; 438/294

(58) Field of Classification Search
USPC ........................ 365/185.29; 257/314; 438/294
See application file for complete search history.

(56) References Cited

U.S. PATENT DOCUMENTS

| | | | |
|---|---|---|---|
| 8,570,802 B2 * | 10/2013 | Shirakawa | ............... 365/185.03 |
| 8,786,014 B2 * | 7/2014 | Nagai | ........................... 257/334 |
| 2011/0316065 A1 | 12/2011 | Murata et al. | |

FOREIGN PATENT DOCUMENTS

KR    10201200278    2/2013

* cited by examiner

*Primary Examiner* — Fernando Hidalgo
(74) *Attorney, Agent, or Firm* — IP & T Group LLP

(57) ABSTRACT

Disclosed are a non-volatile memory device and a method of fabricating the same. The non-volatile memory device includes a semiconductor substrate including a plurality of active regions and a pair of first pillars protruding from each active region. A pair of drain selection lines surround each pillar of the pair of first pillars. A pair of second pillars, wherein each second pillar is disposed over a corresponding first pillar, of the pair of the first pillars, and is formed of a semiconductor material. A plurality of word lines and a source selection line form a stack that surrounds the pair of second pillars. A source line is formed over and connected with the pair of second pillars. Drain contacts are formed at both sides of each active region except between pairs of the drain selection lines. A bit line is formed over and connected with the drain contacts.

22 Claims, 16 Drawing Sheets

NON-VOLATILE MEMORY DEVICE AND METHOD OF FABRICATING THE SAME

CROSS-REFERENCE TO RELATED APPLICATIONS

The present application claims priority of Korean Patent Application No. 10-2012-0147365, filed on Dec. 17, 2012, which is incorporated herein by reference in its entirety.

BACKGROUND

1. Field

Exemplary embodiments of the present invention relate to a non-volatile memory device and a method of fabricating the same, and more particularly, to a non-volatile memory device that includes a plurality of memory cells stacked vertically from a substrate, and a method of fabricating the same.

2. Description of the Related Art

A non-volatile memory device is a memory device in which stored data is maintained as it is even when power supply is cut off. Currently, a variety of non-volatile memory devices, for example, a NAND flash memory and the like are widely utilized.

Recently, as an improvement in the degree of integration of a two-dimensional non-volatile memory device which forms a single memory cell over a silicon substrate reaches the limit, a variety of three-dimensional non-volatile memory devices are proposed in which a plurality of memory cells is stacked vertically from the silicon substrate.

A general three-dimensional non-volatile memory device includes a channel extending in a vertical direction from a substrate, a source selection transistor, a plurality of memory cells, and a drain selection transistor which are sequentially stacked along the channel, a source line which is formed by ion injection into the substrate and connected to one end of the source selection transistor, and a bit line which is disposed over the drain selection transistor and connected to one end of the drain selection transistor. In such a structure, since the source line is formed by the ion injection process, there is a problem in which the resistance of the source line is very increased.

Meanwhile, in the "Pipe-shaped BiCS Flash Memory with 16 Stacked Layers and Multi-Level-Cell Operation for Ultra High Density Storage Devices", VLSI Technology, 2009 symposium, ISBN 978-4-86348-009-4, pp. 136-137 which is a document disclosed on Jun. 16 to 18, 2009, there is disclosed a flash memory called a "PBiCS" structure. Unlike the general three-dimensional non-volatile memory device in which the bit and source lines are respectively disposed over and under the stacked memory cell, the flash memory has a structure in which all of bit and source lines are disposed over a stacked memory cell. Accordingly, a metal source line may be formed, thereby enabling the resistance of the source line to be reduced.

However, in the PBiCS structure, a channel is separated from a substrate body. Thus, it may impossible to perform an erase operation in an F-N tunneling manner that applies a high voltage to the substrate body to inject a charge storage layer of the memory cell with holes, as the related art. Instead of that, data is erased in a manner of injecting a channel with holes created by applying a high voltage to a selection gate to generate a GIDL (Gate Induced Drain Leakage) current. Incidentally, source and drain junctions on the upper end of the channel should sufficiently overlap with the selection gate in order to generate the GIDL current. For this reason, there are caused problems such as an increase in leakage current of the selection gate, a deterioration of switching characteristics, a dispersion increase of a threshold voltage, and an inability to adjust the threshold voltage. As a result, there are problems that it is difficult to control the erase operation and efficiency is deteriorated.

In addition, in the PBICS structure, the channel has a U-shape while being entirely formed of polysilicon. Therefore, there are problems in that an operating current is decreased equal to or more than 50% and a selection transistor has poor characteristics, compared with a structure having an I-shaped channel.

Accordingly, there is a need to realize a three-dimensional non-volatile memory device having a new structure that can solve the above-mentioned problems.

SUMMARY

An exemplary non-volatile memory device includes a semiconductor substrate including a plurality of active regions extending in a first direction and a pair of first pillars protruding from each active region, of the plurality active regions; a pair of drain selection lines extend in a second direction intersecting with the first direction, wherein each drain selection line of the pair of drain selection lines surrounds each first pillar of the pair of first pillars; a pair of second pillars, wherein each second pillar, of the pair of second pillars, is disposed over a corresponding first pillar, of the pair of the first pillars, and is formed of a semiconductor material; a plurality of word lines and a source selection line extend in the second direction and form a stack that surrounds the pair of second pillars and stacked along a length of the pair of second pillars; a source line formed over and connected with the pair of second pillars, the source line extending in the second direction; drain contacts formed over each active region, of the plurality of active regions, at both sides of the pair of drain selection lines except between each drain selection line of the pair of drain selection lines; and a bit line formed over and connected with the drain contacts, the bit lines extending in the first direction.

An exemplary method of manufacturing a non-volatile memory device includes forming a plurality of active regions extending in a first direction and a pair of first pillars protruding from each active region, of the plurality active regions by etching a semiconductor substrate; forming a pair of drain selection lines extending in a second direction intersecting with the first direction, wherein each drain selection line of the pair of drain selection lines surrounds each first pillar of the pair of first pillars; forming, over the drain selection lines and the pairs of first pillars, an alternately-stacked structure, including a plurality of interlayer insulating layers and a plurality of conductive layers that are alternately stacked, or a plurality of interlayer insulating layers and a plurality of second sacrificial layers that are alternately stacked; forming, through the alternately-stacked structure, a pair of second pillars that are connected with the pair of first pillars; forming, over the pair of second pillars, a source line that is connected with the pair of second pillars and extends in the second direction; forming drain contacts, over each active region, of the plurality of active regions, at both sides of the pair of drain selection lines except between each drain selection line of the pair of drain selection lines; and forming, over the drain contacts, a bit line that is connected with the drain contacts and extends in the first direction.

An exemplary non-volatile memory device includes a semiconductor substrate including an active region having a first pillar that protrudes from the active region; a drain selection gate surrounding the first pillar; a second pillar disposed over the first pillar, and formed of a semiconductor material; a plurality of memory cell gates and a source selection gate stacked along a length of the second pillar and surrounding the second pillar; a source line farmed over and connected with the second pillar; and a bit line disposed over the second pillar, and connected with the active region at one side of the drain selection gate through a drain contact.

DETAILED DESCRIPTION

Figure 1A:
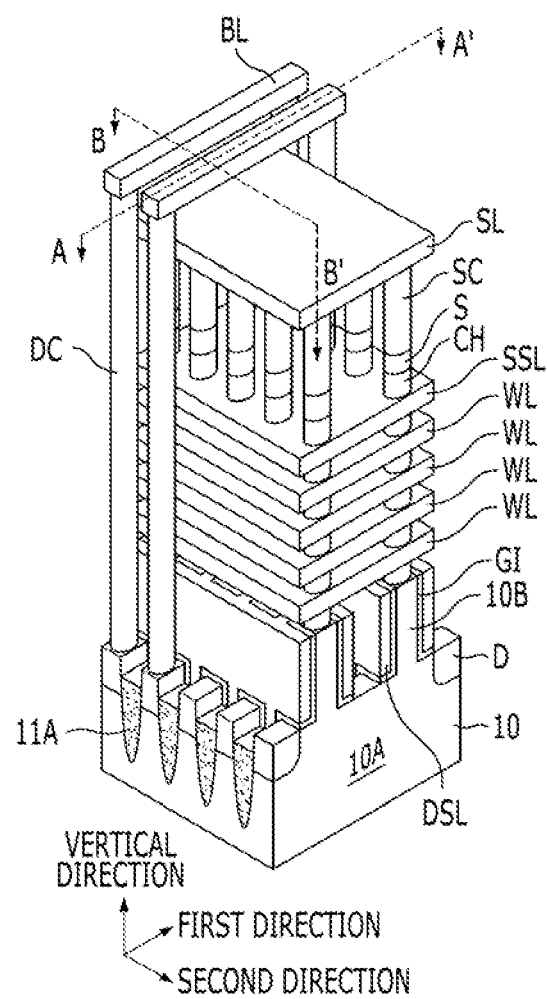
FIGS. 1A and 1B are a perspective view and a circuit diagram illustrating an exemplary non-volatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
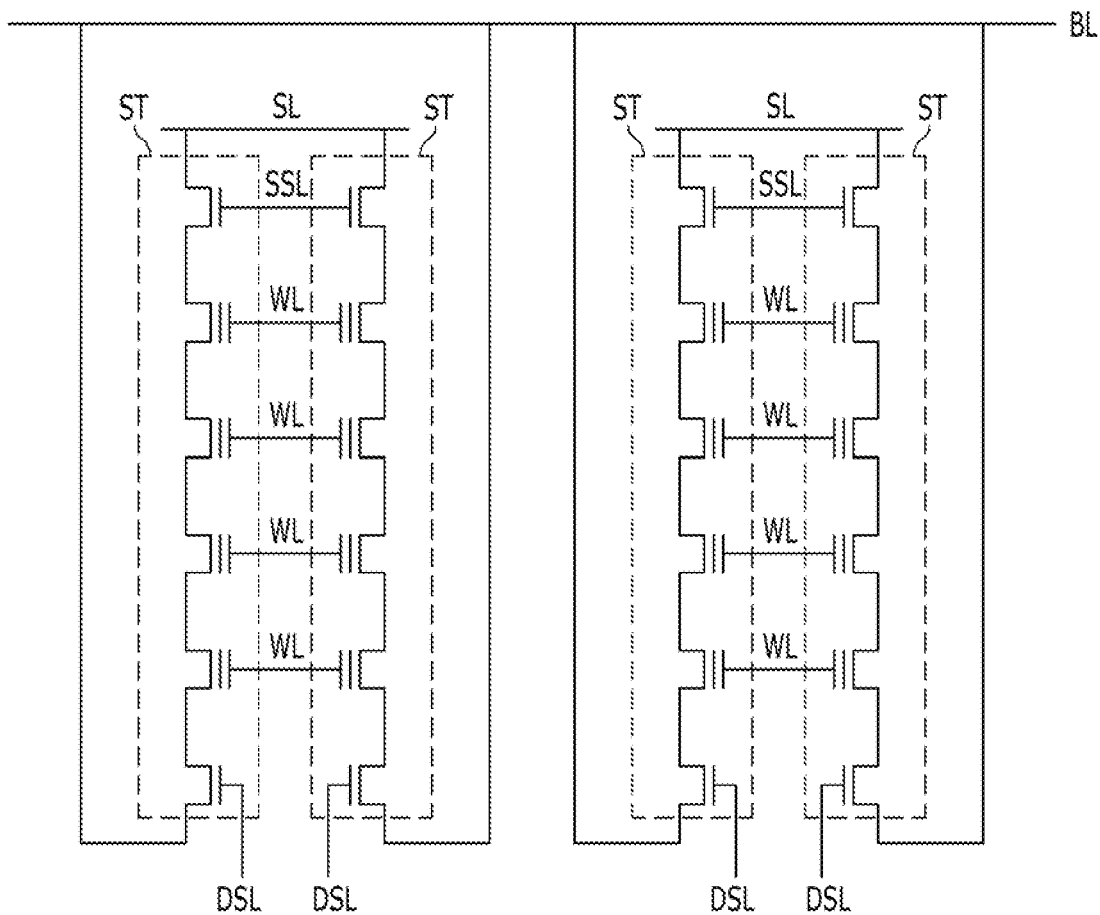

FIGS. 1A and 1B are a perspective view and a circuit diagram illustrating an exemplary non-volatile memory device that may include a plurality of strings ST, each of which includes a drain selection transistor, a plurality of memory cells, and a source selection transistor that are connected in series between each bit line BL, of a plurality of bit lines and each source line SL of a plurality of source lines.

The plurality of bit lines BL extend in a first direction and are spaced apart from each other in a second direction. A plurality of source lines SL extend in the second direction and are spaced apart from each other in the first direction, and intersect the plurality of bit lines BL. In this case, one source line SL is connected with a pair of strings ST in the first direction, and the pair of strings ST is arranged in the second direction in the same number as that of the bit lines BL. That is, if the number of bit lines BL is N, then the number of the strings ST connected to one source line SL becomes 2×N. In addition, if the number of the source lines SL connected to one bit line BL is M, then the number of the strings ST connected to one bit line BL becomes 2×M. For convenience of description, FIG. 1A is illustrated based on one source line SL, and FIG. 1B is illustrated based on one bit line BL and two source lines SL connected thereto. However, as described above, the plurality bit lines BL may be arranged in the second direction, and the plurality source lines SL may be arranged in the first direction.

The pluralities of bit lines BL and source lines SL are disposed over the strings ST. Each of the strings ST includes the drain selection transistor, the plural memory cells, and the source selection transistor, which are stacked along a channel protruding in a vertical direction from a semiconductor substrate 10. Specifically, these may be arranged as the following exemplary structure.

The semiconductor substrate 10 includes a plurality of active regions 10A defined by isolation layers 11A. A plurality of active pillars 10B protrude from the plurality of active regions 10A in a direction perpendicular to a surface of the semiconductor substrate 10. The semiconductor substrate 10 may be formed of a P-type semiconductor, for example, P-type silicon, or be formed of a single-crystal semiconductor, for example, single-crystal silicon. The plurality of active regions 10A and the plurality of active pillars 10B may be formed of the same material as the semiconductor substrate 10. Here, each active region 10A, of the plurality of active regions 10A, has a line shape extending in the first direction, and corresponds to a bit line BL of the plurality of bit lines BL. The plurality of active pillars 10B are disposed over the plurality of active regions 10A, and a source line SL is connected with two active pillars 10B of each active region 10A. Hereinafter, for convenience of description, two active pillars 10B, which are disposed over one active region 10A and connected to the same source line SL, are referred to as a pair of active pillars 10B.

Drain selection lines DSL extend in the second direction and surround side walls of the plurality of active pillars 10B. A pair of drain selection lines DSL encloses each active pillar 10B, of the pair of active pillars 10B, and are separated from each other by an active pillar 10B. A gate insulating layer GI is interposed between each drain selection line DSL and the semiconductor substrate 10 and between each drain selection line DSL and an active pillar 10B. One drain selection transistor is configured by one active pillar 10B. Each active pillar 10B is used as a channel of each drain selection transistor. Each drain selection line DSL is used as a drain selection gate in each drain selection transistor.

Pillar-shaped channel layers CH are disposed over each active pillar 10B. Each of the channel layer CH may be formed of a semiconductor material such as polysilicon. Hereinafter, the channel layers CH, which are formed over each of the pair of active pillars 10B, are referred to as a pair of channel layers CH.

A plurality of word lines WL and a source selection line SSL are stacked along the pair of channel layers CH. Each word line WL and the source selection line SSL are separated from each other by an insulating layer, which is not shown. In this case, each of the word lines WL and the source selection line SSL extends in the second direction and surrounds the pair of channel layers CH.

A memory layer (not shown) may be interposed between each word line WL and each channel layer CH. The memory layer is a layer which stores/discharges a charge to store data. For example, the memory layer may include a tunnel insulating layer, a charge storage layer, and a charge blocking layer that are sequentially disposed from a side close to the associated channel layer CH. The tunnel insulating layer and the charge blocking layer may be, for example, oxide layers, and the charge storage layer may be, for example, a nitride layer capable of a charge trap. However, the tunnel insulating layer, the charge storage layer, and the charge blocking layer are not limited thereto. One memory cell is configured by one channel layer CH, one word line WL surrounding the side wall of the channel layer CH, and the memory layer interposed therebetween. The word line WL is used as a gate of each memory cell.

A gate insulating layer (not shown) may be interposed between the source selection line SSL and the pair of channel layers CH. Here, the gate insulating layer may be a single layer or multiple layers, including an oxide layer or a nitride layer. Depending on the manufacturing process, the gate insulating layer may also be the same material as the memory layer. One source selection transistor is configured by one channel layer CH, the source selection line SSL surrounding the side wall of the channel layer CH, and the gate insulating layer interposed therebetween. The source selection line SSL is used as a source selection gate of each source selection transistor.

Each channel layer CH is provided, on an upper end thereof, with a source region S as a junction region of the source selection transistor. Drain regions D, as junction regions of the drain selection transistors, are provided at sides of each active region 10A, except between the pair of drain selection lines DSL.

One string ST includes, stacked along the active pillar 106 and the channel layers CH, one active pillar 10B, the channel layers CH formed over the one active pillar, the drain selection transistor, the plurality of memory cell, and the source selection transistor. One end of each string ST is connected to the source line SL through a source contact SC formed over each source region S, and the other end of each string ST is connected to the bit line BL through a drain contact DC formed over each drain region D. However, the source contact SC may be omitted, and thus, the source line SL may also come into direct contact with the upper end of the channel layer CH provided with the source region S. In order to clearly show the other components, the perspective view of FIG. 1A shows only the drain contacts DC that are disposed over two active regions 10A and two bit lines BL that are connected with the drain contacts DC. However, there may be the drain contacts DC that are disposed over each active region 10A, and the bit lines BL that are connected with the drain contacts, respectively.

Two strings ST, which are disposed over one active region 10A and connected to the same source line SL, are referred to as a pair of strings ST. One source line SC is commonly connected with one end of the pair of strings ST, which are arranged in the second direction in the same number as that of the bit lines BL or the active regions 10A. The other end of the pair of strings ST are connected to the same bit line BL.

The bit lines BL and the source line SL may be formed of a low resistance material, such as a metal.

In addition, a channel layer CH may be directly connected to the active region 10A of the semiconductor substrate 10, which is formed of a P-type semiconductor, through an active pillar 10B. Thus, since an erase operation may be performed in a manner that applies an erase voltage, which is a high positive voltage, to the semiconductor substrate 10 to inject the channel layer CH with holes, an erase operation in the F-N tunneling manner may be performed with improved results.

In addition, since the channel—the active pillar 10B and the channel layer CH—of each string ST has an I-shape, an operating current may be increased equal to or more than two times, compared with the PBiCS structure of the related art.

Furthermore, since the active pillar 10B, which is the channel of the selection transistor, particularly the drain selection transistor, may be formed of single-crystal silicon it may be possible to improve selection transistor characteristics.

Hereinafter, an example of an exemplary method of fabricating the semiconductor memory device shown in FIGS. 1A and 1B will be described with reference to FIGS. 2A to 14. The perspective views are shown together if necessary, based on the cross-sectional views. In the perspective views, a portion of components such as an insulating layer among the components shown in the cross-sectional views is not shown for a clear expression of the components. In addition, the perspective views and the cross-sectional views are shown based on one source line SL as indicated in FIG. 1A. Particularly, the cross-sectional views show cross sections taken along line A-A' and line B-B'.

Figure 2A:
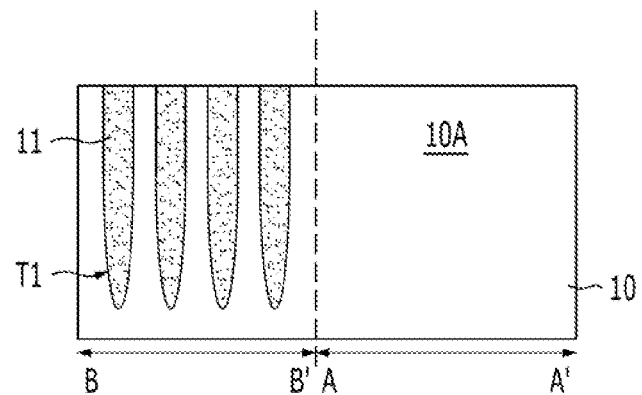
FIGS. 2A to 14 are views for explaining an exemplary method of fabricating the non-volatile memory device illustrated in FIGS. 1A and 1B.
Figure 2B:
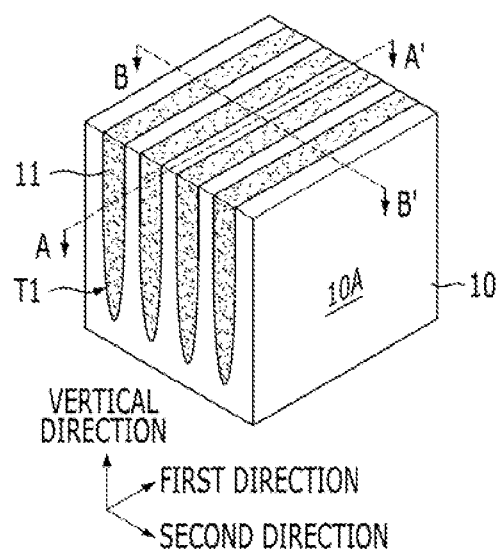

Referring to FIGS. 2A and 2B, a semiconductor substrate 10 is prepared. The semiconductor substrate 10 may be formed of a P-type semiconductor for example, P-type silicon, or be formed of a single-crystal semiconductor, for example, single-crystal silicon.

Next, first trenches T1 are formed by selectively etching an isolation region of the semiconductor substrate 10. A plurality of active regions 10A are defined in the semiconductor substrate 10 by the first trenches T1. In this case, each of the first trenches T1 has a depth that may exceed the sum of a channel height of a drain selection transistor to be described later and a height of an isolation layer to be described later by a predetermined amount. The predetermined amount may be adjusted based on a process margin.

Subsequently, preliminary isolation layers 11 are formed by forming an insulating material, such as oxide, in each first trench T1.

Figure 3A:
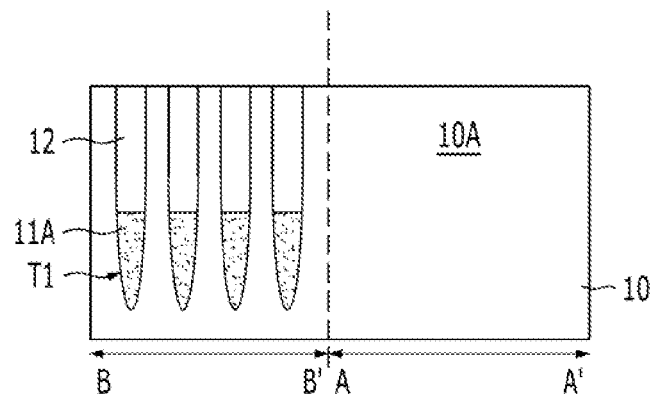
Figure 3B:
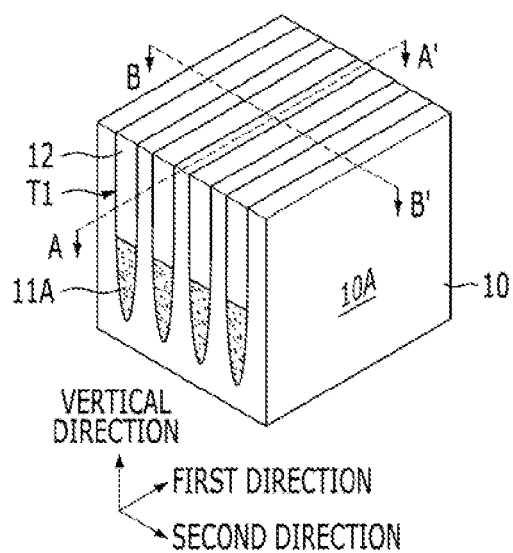

Referring to FIGS. 3A and 3B, final isolation layers 11A, having a desired height, are formed by removing upper portions of the preliminary isolation layers 11 using etching.

Next, first sacrificial layers 12 are formed in the first trenches T1, in the spaces formed by the removal of the preliminary isolation layers 11. The first sacrificial layers 12 may be formed of an insulating material, for example, a nitride having an etching rate different from the isolation layers 11A.

Figure 4A:
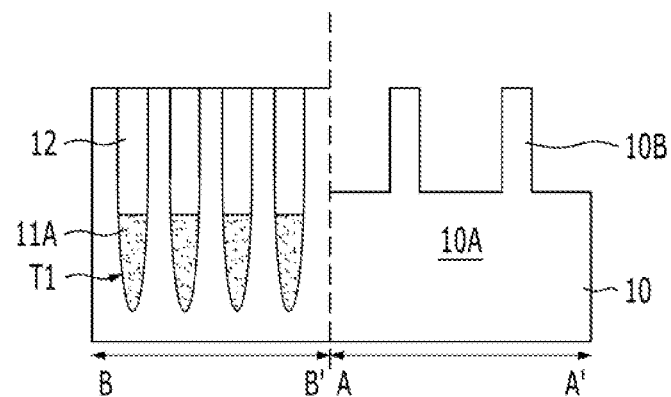
Figure 4B:
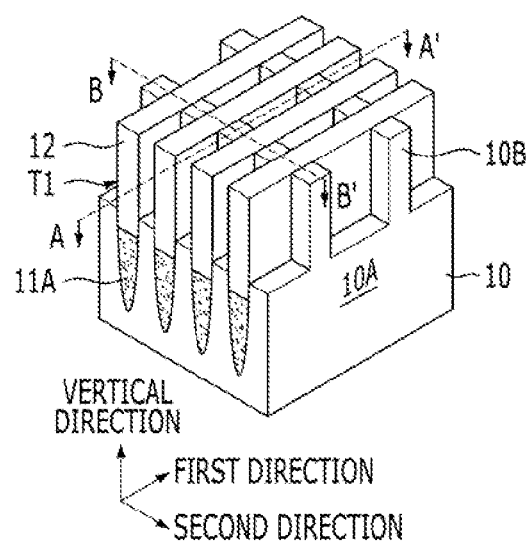

Referring to FIGS. 4A and 4B, active pillars 10B that protrude in a direction perpendicular to a surface of the semiconductor substrate are formed by selectively etching each of the active regions 10A.

The present drawings are shown based on one source line SL. A pair of active pillars 10B is illustrated on each active region 10A, but the number of active pillars 10B is not limited thereto. A plurality of pairs of active pillars 10B may be formed on each active region 10A along a first direction (see FIG. 15 to be described later). The active region 10A may be selectively etched using a plurality of line masks that extend in a second direction, while covering a region to be formed with the active pillars 10B.

Here, each of the active pillars 10B is a portion to be used as a channel of the drain selection transistor, and may have a length that is greater, by a predetermined amount, than a desired channel length. This is because a portion of the active pillar 10B may be lost during a follow-up process (for example, a planarization process in FIGS. 8A and 8B). In an exemplary embodiment, lower ends of the active pillars 10B are located higher than upper surfaces of the isolation layers 11A, but the active pillars 10B are not limited thereto. For example, the lower ends of the active pillars 10B may be located equal to or lower than upper surfaces of the isolation layers 11A.

Subsequently, although not shown in the present drawings, an implant process for adjusting a threshold voltage of the drain selection transistor may be performed at the active pillar 10B. The implant process may be performed in a tilt manner or a rotation manner, so that the active pillar 10B may be evenly doped with an impurity.

Figure 5:
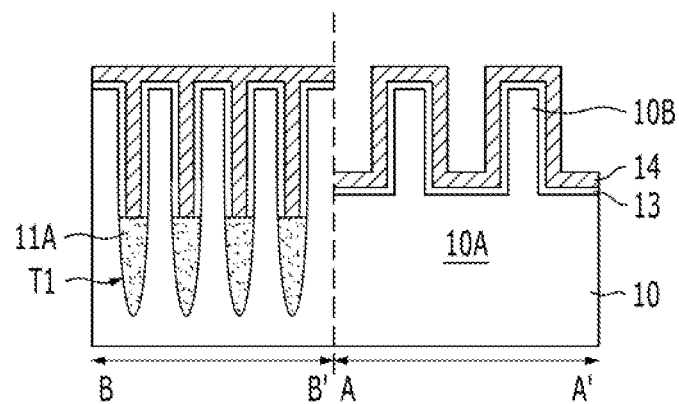

Referring to FIG. 5, the first sacrificial layers 12 are removed. The first sacrificial layers 12 may be removed, for example, using a wet etching process.

Next, a gate insulating layer 13 is formed on a surface of the active region 10A, including the active pillars 10B exposed after the first sacrificial layers 12 are removed. The gate insulating layer 13 is a gate insulating layer of the drain selection transistor, and may be formed by a thermal oxidation process with respect to the resultant structure from which the first sacrificial layers 12 are removed, for example.

Subsequently, a first conductive layer 14 is deposited over the resultant structure including the gate insulating layer 13 along a lower profile. The first conductive layer 14 may be formed of, for example, tungsten, polysilicon doped with impurities, silicide, or the like, but first conductive layer 14 is not limited thereto. For example, the first conductive layer 14 may also be formed of any conductive material capable of be etched.

Figure 6:
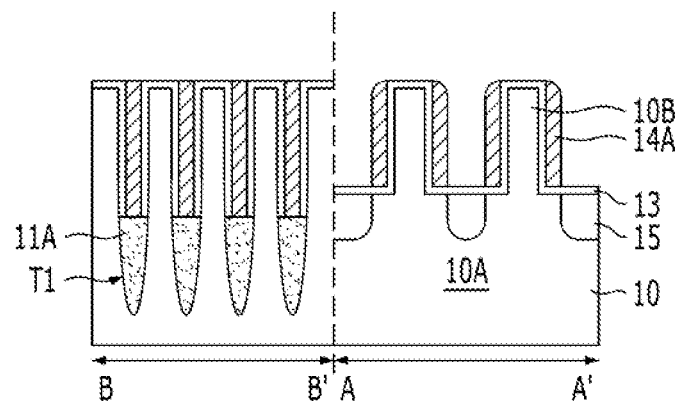

Referring to FIG. 6, first conductive layer patterns 14A are formed by etchback of the first conductive layer 14 until the gate insulating layer 13 is exposed. In such an etchback process, the gate insulating layer 13 may be removed and the active region 10A may also be exposed. The first conductive layer patterns 14A extend in the second direction and surround the active pillars 10B arranged in the second direction, and are separated from each other in the first direction.

Next, LDD (Lightly Doped Drain) regions 15 are formed by injecting a low concentration of an N-type impurity into the active region 10A between the first conductive layer patterns 14A.

Figure 7:
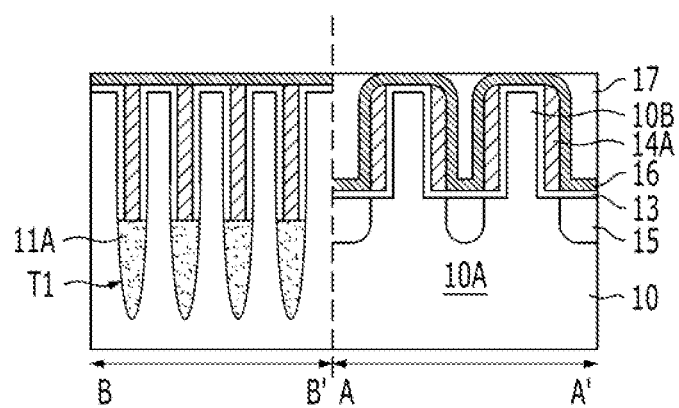

Referring to FIG. 7, a first capping layer 16 is formed which caps the first conductive layer patterns 14A along the lower profile over the resultant structure of the process in FIG. 6. The first capping layer 16 may be formed of, for example, an insulating material, such as a nitride.

Next, an insulating material, such as an oxide, is formed over the first capping layer 16. The insulating material is planarized (e.g., by CMP (Chemical Mechanical Polishing)) until the first capping layer 16 is exposed. Thus, the insulating forms first interlayer insulating layers 17, which are formed between.

Figure 8A:
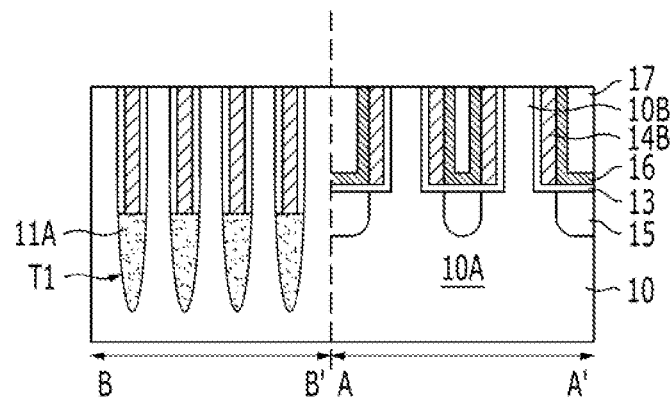
Figure 8B:
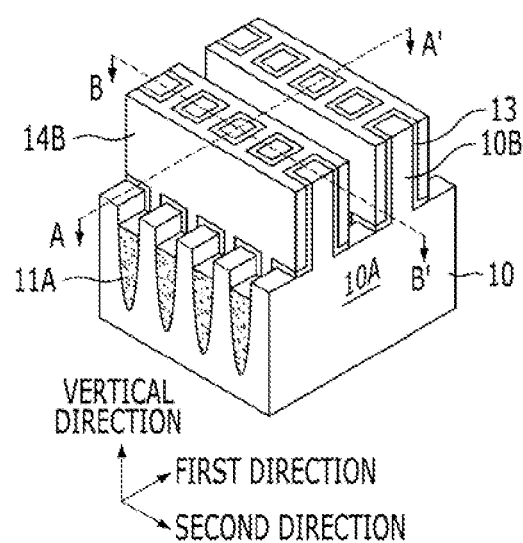

Referring to FIGS. 8A and 8B, a planarization process is performed so that an upper surface of each active pillar 10B is exposed. The planarization process may be performed using etchback, CMP, or a combination thereof. For example, after the etchback of the first capping layer 16 until the gate insulating layer 13 is exposed, a touch CMP process may be performed until the upper surface of the active pillar 10B is exposed. In the present process, each first conductive layer pattern 14A may have a height decreased by a predetermined amount. Hereinafter, this is referred to as a drain selection line, which is designated by reference numeral 14B.

As a result of the exemplary process, a plurality of drain selection transistors is formed, each of which includes one active pillar 10B, the drain selection lines 14B surrounding the active pillar 10B, and the gate insulating layers 13 interposed therebetween.

Figure 9:
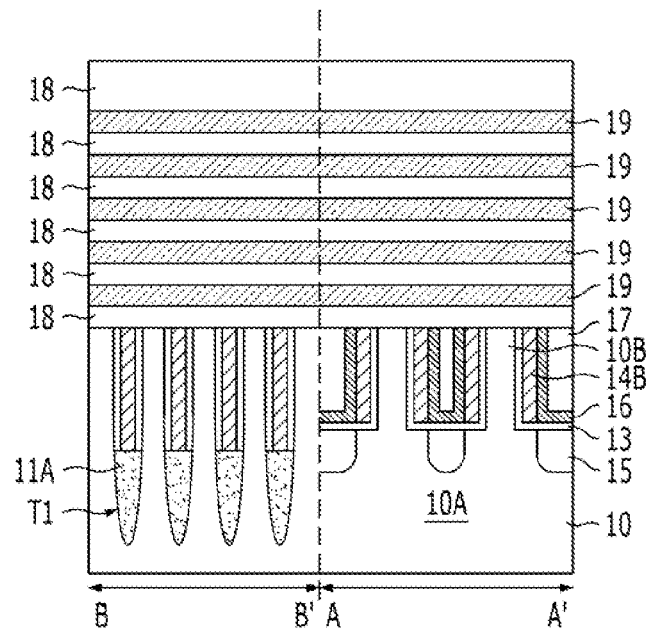

Referring to FIG. 9, a plurality of second interlayer insulating layers 18 and a plurality of second conductive layers 19 are alternately stacked over the resultant structure of the process in FIGS. 8A and 8B.

The second conductive layers 19 are to form word lines and a source selection line, and each of the second conductive layers 19 may be formed of, for example, a metal material or polysilicon doped with an impurity. Each of the second interlayer insulating layers 18 is a layer to separate the plural second conductive layers 19 from each other, and may be formed, for example, from an oxide.

Figure 10:
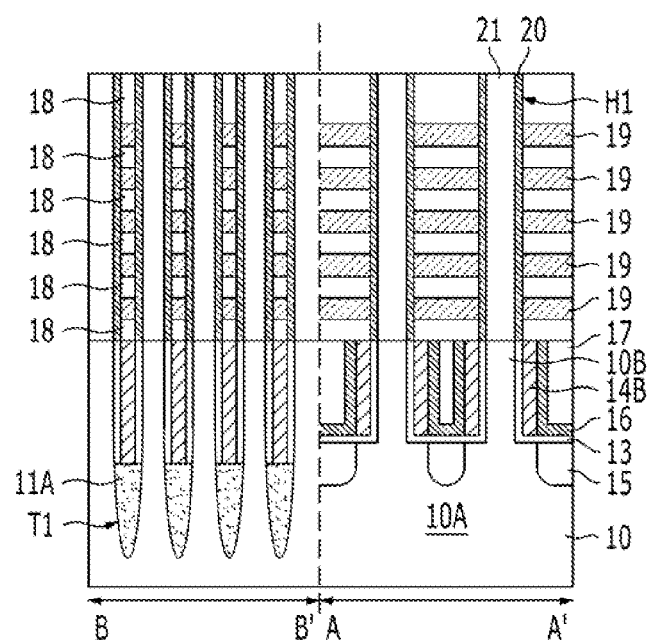

Referring to FIG. 10, a plurality of channel holes H 1 exposing the plurality of active pillars 10B are formed by selectively etching the alternately-stacked structure of the second interlayer insulating layers 18 and second conductive layers 19.

Next, a memory layer 20 and a channel layer 21 are formed on a sidewall of the alternately-stacked structure of the second interlayer insulating layers 18 and second conductive layers 19 that defines each of the plurality of channel holes H1. Each of the memory layers 20 may include a tunnel insulating layer, a charge storage layer, and a charge blocking layer, for example, an oxide layer-a nitride layer-an oxide layer, which are sequentially disposed from the side wall of the channel hole H1. The channel layer 21 has a pillar shape extending in a direction perpendicular to a surface of the substrate and is connected with each active pillar 10B, and may be used as a channel for memory cells and a source selection transistor. The channel layer 21 may be formed of, for example, a semiconductor material such as polysilicon. In addition, the channel layer 21 may have a solid pillar shape or a hollow cylindrical shape.

Meanwhile, although the process of FIGS. 9 and 10 has been described as forming the second conductive layers 19 for the word and source selection lines together and forming the channel layers 21 and the memory layers 20, which pass through the second conductive layers 19 together, the second conductive layers 19, the channel layers 21, and the memory layers 20 are not limited thereto. Although not shown, alternatively, a process of forming a conductive layer for a word line, and a channel layer and a memory layer that pass through the conductive layer, and a process of forming a conductive layer for a source selection line, and a channel and a gate insulating layer that pass through the conductive layer, may be performed. In this case, the memory layer may not be interposed between the conductive layer for the source selection line and the channel.

Figure 11A:
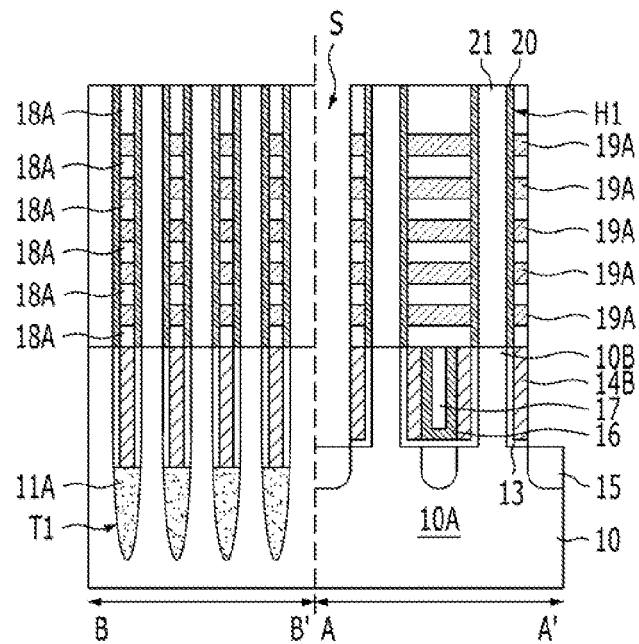
Figure 11B:
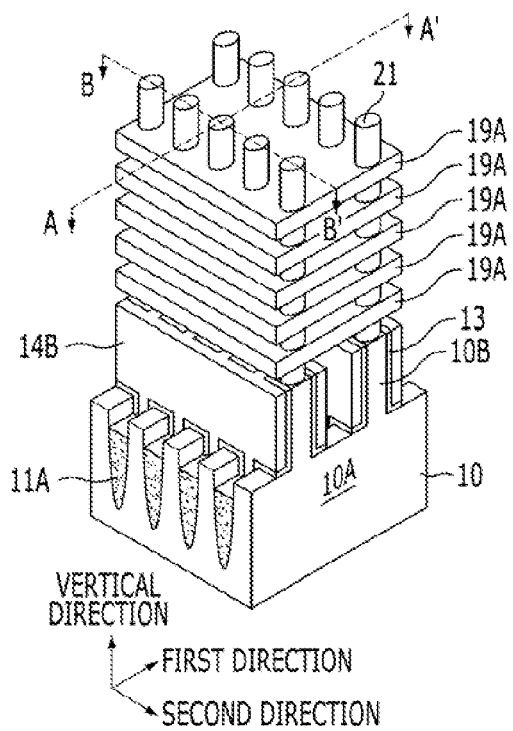

Referring to FIGS. 11A and 11B, the alternately-stacked structure of the second interlayer insulating layers 18 and second conductive layers 19 are selectively etched to form a slit S that separates the word lies and the source selection line for each source line. The first capping layer 16 and the first interlayer insulating layer 17, which are exposed by the etching of the alternately-stacked structure of the second interlayer insulating layers 18 and second conductive layers 19, are etched, via the slit S, until the active regions 10A are exposed. The slit S may be a line shape extending in the second direction.

As a result of an exemplary process, alternately-stacked structure of second interlayer insulating layer patterns 18A and second conductive layer patterns 19A extends in the second direction and surrounds a pair of channel layers 21 adjacent to each other in the first direction. One or more second conductive layer patterns 19A located at the uppermost portion may be used as the source selection line, and the remainder may be used as the word lines. One memory cell is configured by one channel layer 21, one word line WL surrounding the channel layer 21, and the memory layer 20 interposed therebetween. One source selection transistor is configured by one channel layer 21, the source selection line surrounding the channel layer 21, and the memory layer 20 interposed therebetween.

Both sides of the active regions 10A are exposed, except between pair of drain selection lines adjacent to each other in the first direction. The above-mentioned LDD regions 15 may be formed at the both sides of the active regions 10A.

Figure 12A:
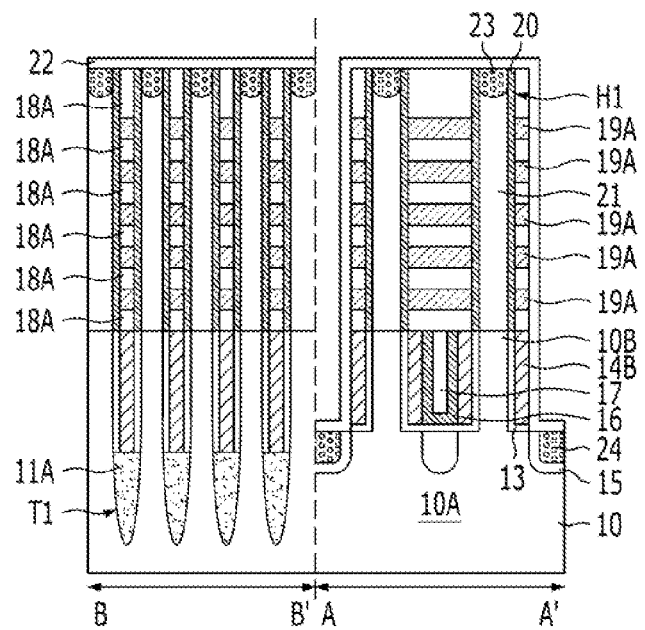
Figure 12B:
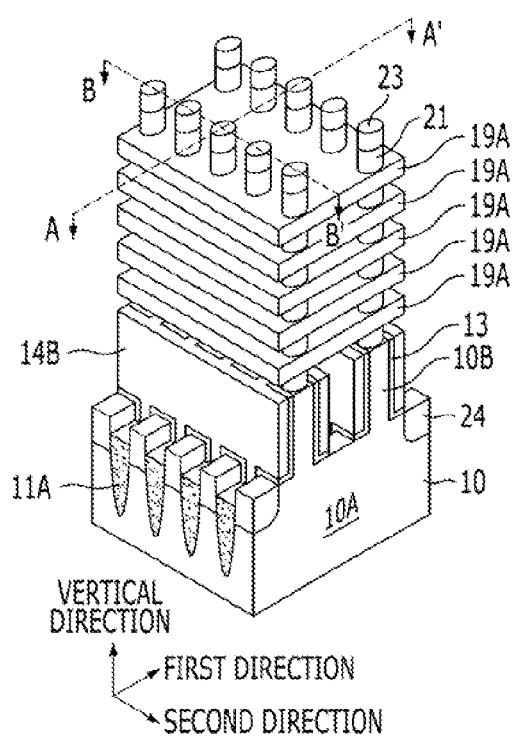

Referring to FIGS. 12A and 12B, after forming a second capping layer 22 to protect the memory cells during an ion injection process along an entire surface of the resultant structure of the process in FIGS. 11A and 11B, the ion injection process is performed in order to form junction regions. Consequently, source regions 23 are respectively formed on upper ends of the channel layers 21, and drain regions 24 are formed within the exposed active regions 10A.

Here, the second capping layer 22 may be formed of an insulating material, such as a nitride. Each of the source regions 23 and drain regions 24 may be formed by injecting an N-type impurity having a high concentration, as compared with each LDD region 15. The drain regions 24 may be formed within the LDD region 15, but is not limited thereto.

Figure 13:
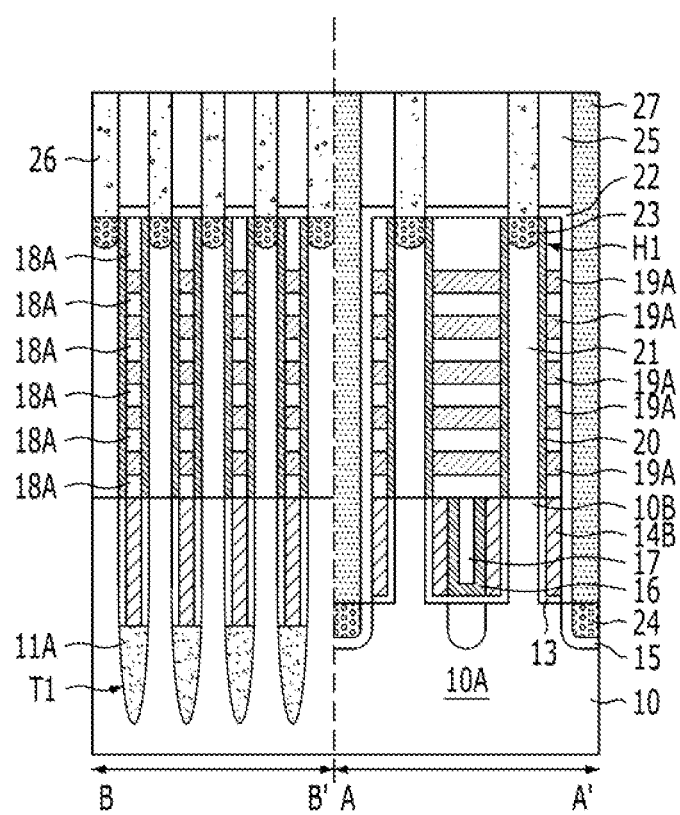

Referring to FIG. 13 after forming a third interlayer insulating layer 25, which covers the resultant structure of the process in FIGS. 12A and 12B, contact holes that expose each source region 23 and each drain region 24 are formed by selectively etching the third interlayer insulating layer 25 and the second capping layer 22. Then, a first conductive contact 26 and a second conductive contact 27, which are connected with the source region 23 and the drain region 24, respectively, are formed by forming a conductive material in the contact holes. The first conductive contact 26 corresponds to the source contact SC of FIG. 1A.

Figure 14:
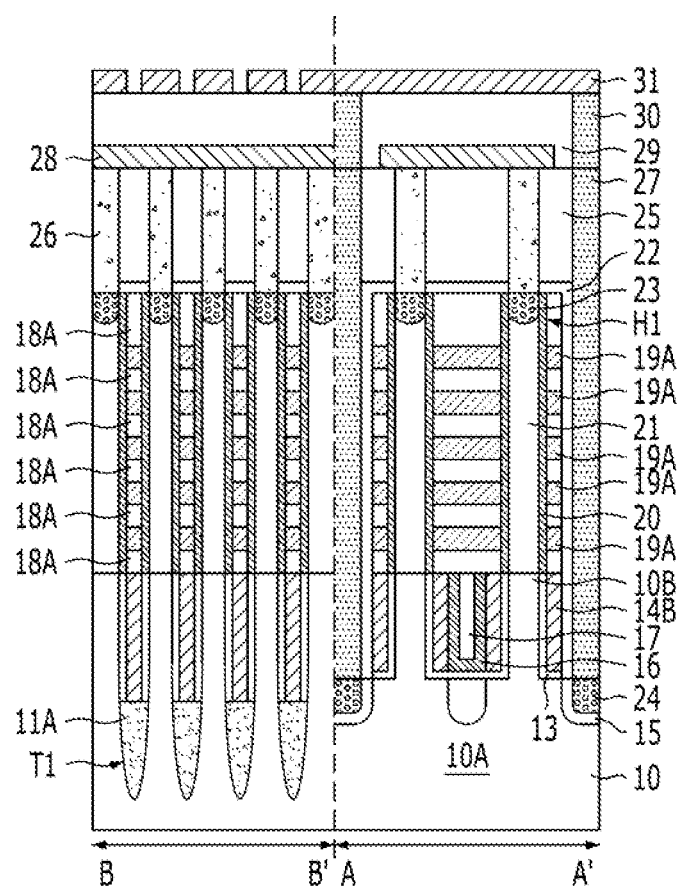

Referring to FIG. 14, a conductive material for forming a source line is deposited over the resultant structure of the process in FIG. 13, and then patterned. Consequently, a source line 28 that extends in the second direction while coming into contact with a pair of first conductive contacts 26 in the first direction is formed.

Next, after forming a fourth interlayer insulating layer 29, which covers the resultant structure formed with the source line 28, contact holes that expose the second conductive contacts 27 are formed by selectively etching the fourth interlayer insulating layer 29. Then, third conductive contacts 30, which are connected with the second conductive contacts 27, are formed by forming a conductive material in the contact holes. The second and third conductive contacts 27 and 30 correspond to the drain contacts DC of FIG. 1A.

Subsequently, a conductive material is deposited over the fourth interlayer insulating layer 29 and the third conductive contacts 30, and then patterned. Consequently, there is formed a bit line 31 that extends in the first direction while coming into contact with third conductive contacts 30. The second and third conductive contacts 27 and 30, which are formed over the same active regions 10A are connected to the same bit line 31.

The device shown in FIGS. 1A and 1B may be fabricated by the above-mentioned method.

Figure 15:
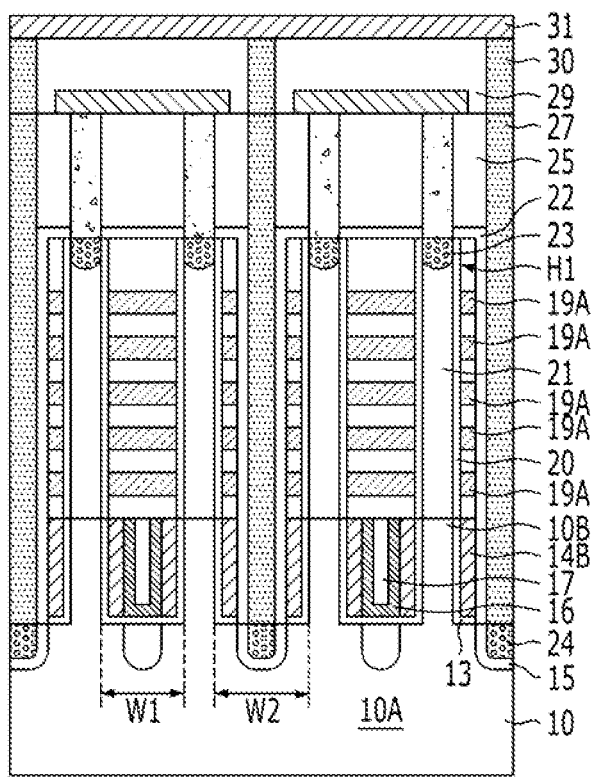
FIG. 15 is a view illustrating a cross section, in an A-A' direction, when two source lines are arranged in a first direction in an exemplary non-volatile memory device.

Meanwhile, the drawings of the present example are illustrated based on one source line SL, but a plurality of source lines SL may be arranged in the first direction, as described above. In this case, a cross-sectional structure of FIG. 14, taken along line A-A' is repeated along the first direction. For example, when two source lines SL are arranged in the first direction, the cross section in the A-A' direction is the same as shown in FIG. 15. In this case, a width W2, between adjacent active pillars 10B that are connected to different source lines SL may be larger than a width between the pairs of active pillars 10B connected to a single source line SL. This is to provide a space in which the drain contacts 27 and 30 are disposed between the adjacent active pillars 10B connected to the different source lines SL.

FIGS. 16 to 19 are views for explaining an exemplary method of fabricating the device illustrated in FIGS. 1A and 1B. First, the processes of FIGS. 2A to 8B are performed as described above.

Figure 16:
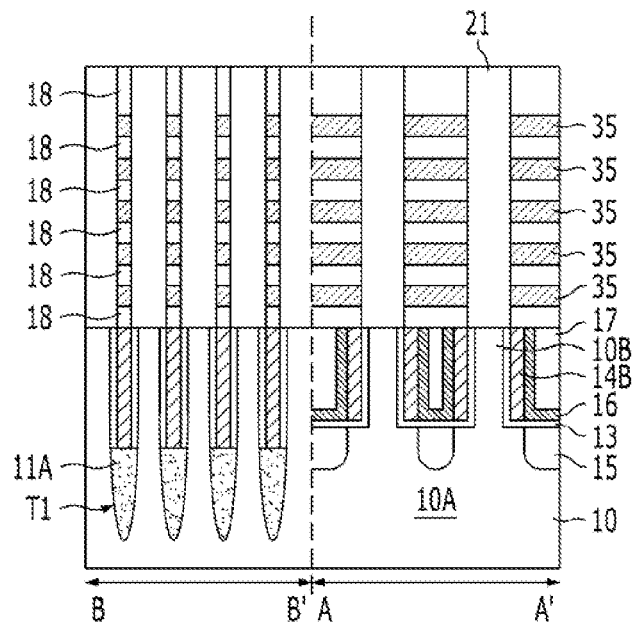
FIGS. 16 to 19 show an exemplary method of fabricating the device illustrated in FIGS. 1A and 1B.

Next, referring to FIG. 16, a plurality of second interlayer insulating layers 18 and a plurality of second sacrificial layers 35 are alternately stacked over the resultant structure produce of the process in FIGS. 8A and 8B.

The plurality of second sacrificial layers 35 are to provide spaces in which the word and source selection lines are formed. Each of the plurality of second sacrificial layers 35 may be formed of an insulating material, for example, a nitride having an etching selection rate different from an etching selection rate of each interlayer insulating layer 18.

A plurality of channel holes are formed, by selectively etching alternately-stacked structure of the second interlayer insulating layers 18 and second sacrificial layers 35, to expose the plurality of active pillars 10B. Channel layers 21 are formed by forming material layers in the channel holes.

Figure 17:
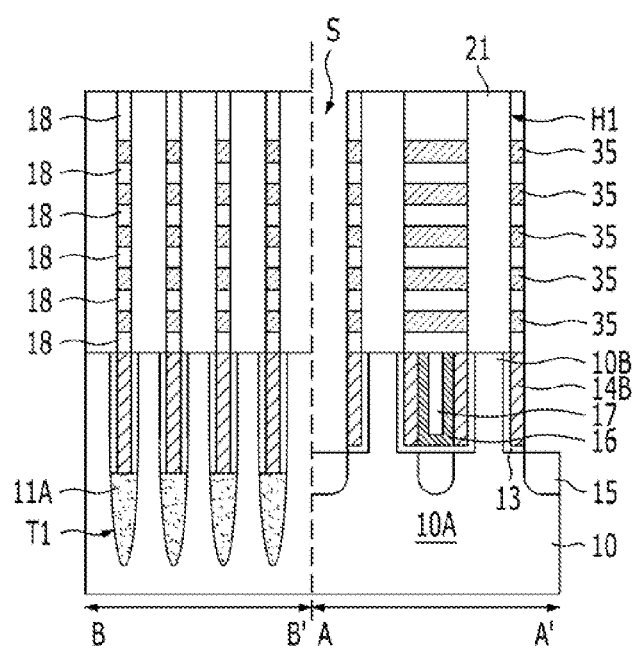

Referring to FIG. 17, a slit S is formed by selectively etching the alternately-stacked structure of the second interlayer insulating layers 18 and second sacrificial layers 35 so that the word lines and the source selection lines are separated for each source line, and then to etch the material layers such as the first capping layer 16 and the first interlayer insulating layer 17 which are exposed by the etching of the alternately-stacked structure of the second interlayer insulating layers 18 and second sacrificial layers 35 until the active region 10A is exposed. The slit S may be a line shape extending in the second direction.

Figure 18:
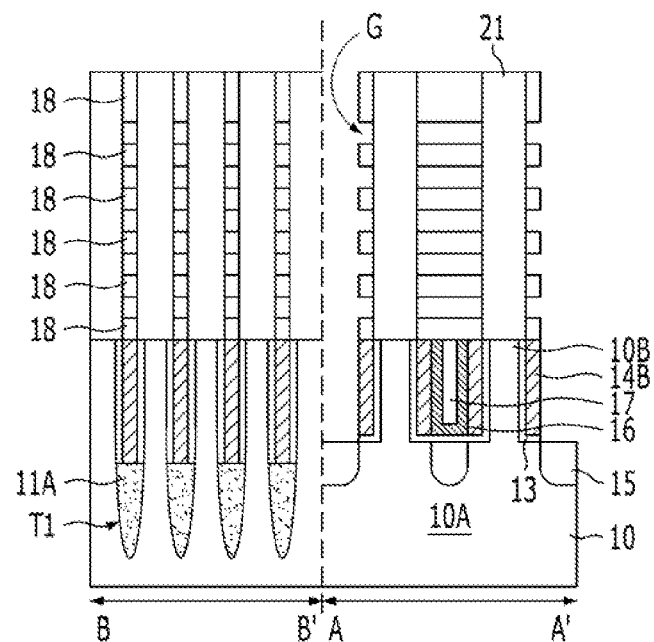

Referring to FIG. 18, the plurality of second sacrificial layers 35 that are exposed by the slit S are removed by etching. A space from which each of the plurality of second sacrificial layers 35 is removed is designated by reference numeral G.

Figure 19:
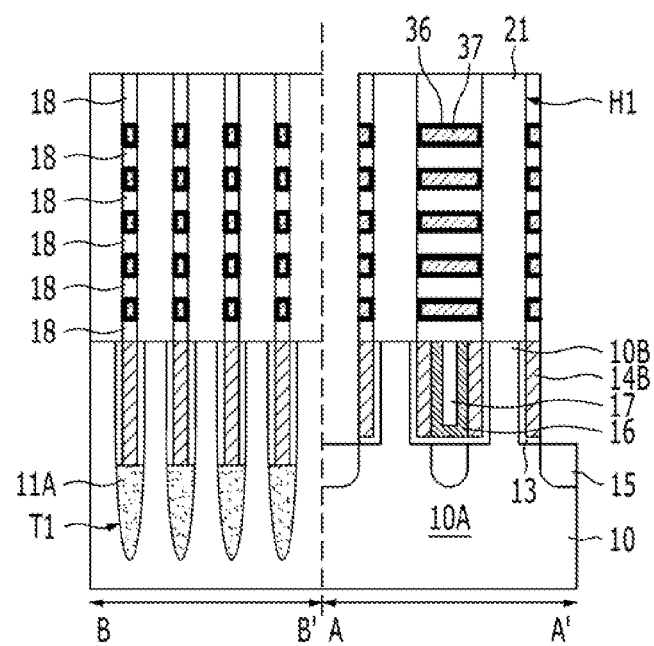

Referring to FIG. 19, a memory layer 36 is formed along an inner wall that defines the spaces from which each second sacrificial layer 35 is removed. A conductive layer pattern 37 and is formed on the memory layer 36. Specifically after depositing material layers, for example, an oxide layer-a nitride layer-an oxide layer to form the memory layers 36 along an entire surface of the resultant structure of the process in FIG. 18, and depositing conductive layers to embed the remaining spaces, etchback may be performed so that the material layers and the conductive layers are formed within the spaces G from which the plurality of second sacrificial layers 35 are removed.

Here, one or more conductive layer patterns 37 located at the uppermost portion among the conductive layer patterns 37, may be used as the source selection line, and the remainder may be used as the word lines. Thus, similarly to described in FIGS. 11A and 11B, it may be possible to obtain a structure formed with the memory cells and the source selection transistor.

Since the following-up processes are substantially identical to described in FIGS. 12A to 14, the detail description thereof will be omitted.

In accordance with an exemplary non-volatile memory device and a method of fabricating the same, it may be possible to easily and efficiently perform an erase operation, improve selection transistor characteristics and an operating current, and reduce the resistance of a source line, also while increasing the degree of integration by vertically laminating memory cells.

Although various embodiments have been described for illustrative purposes, it will be apparent to those skilled in the art that various changes and modifications may be made without departing from the spirit and scope of the invention as defined in the following claims.

What is claimed is:

1. A non-volatile memory device comprising:
a semiconductor substrate including a plurality of active regions extending in a first direction and a pair of first pillars protruding from each active region, of the plurality active regions;
a pair of drain selection lines extend in a second direction intersecting with the first direction, wherein each drain selection line of the pair of drain selection lines surrounds each first pillar of the pair of first pillars;
a pair of second pillars, wherein each second pillar, of the pair of second pillars, is disposed over a corresponding first pillar of the pair of the first pillars, and is formed of a semiconductor material;
a plurality of word lines and a source selection line extend in the second direction and form a stack that surrounds the pair of second pillars and stacked along a length of the pair of second pillars;
a source line formed over and connected with the pair of second pillars, the source line extending in the second direction;
drain contacts formed over each active region, of the plurality of active regions, at both sides of the pair of drain selection lines except between each drain selection line of the pair of drain selection lines; and
a bitline formed over and connected with the drain contacts, the bit lines extending in the first direction.

2. The non-volatile memory device of claim 1, wherein each active region, of the plurality of active regions and the pair of first pillars are formed of a P-type semiconductor.

3. The non-volatile memory device of claim 1, wherein each active region, of the plurality of active regions and the pair of first pillars are formed of a single-crystal semiconductor.

4. The non-volatile memory device of claim 1, further comprising:
a plurality of pairs of first pillars arranged along the first direction, wherein
the plurality of pairs of first pillars arranged along the first direction are connected to the same bit line.

5. The non-volatile memory device of claim 4, wherein the pair of first pillars and a second pair of first pillars, of the plurality of pairs of first pillars, adjacent to the pair of first pillars, share the drain contact that is disposed between the pair of first pillars and the second pair of first pillars.

6. The non-volatile memory device of claim 4, wherein a width between first pillars in the pair of first pillars is smaller than a width between adjacent pairs of first pillars.

7. The non-volatile memory device of claim 2, wherein an erase operation is performed in an F-N tunneling manner by applying an erase voltage to the semiconductor substrate.

8. The non-volatile memory device of claim 1, further comprising:
drain regions formed in each active region at both sides of the pair of drain selection lines except between each drain selection line of the pair of drain selection lines; and
a source region formed in an upper end of each second pillar.

9. The non-volatile memory device of claim 1, wherein the source line is connected directly with the pair of second pillars or is connected with the pair second pillars through a source contact interposed between the source line and the pair second pillars.

10. A method of fabricating a non-volatile memory device, the method comprising:
forming a plurality of active regions extending in a first direction and a pair of first pillars protruding from each active region, of the plurality active regions
by etching a semiconductor substrate;
forming a pair of drain selection lines extending in a second direction intersecting with the first direction, wherein each drain selection line of the pair of drain selection lines surrounds each first pillar of the pair of first pillars;
forming, over the drain selection lines and the pairs of first pillars, an alternately-stacked structure, including a plurality of interlayer insulating layers and a plurality of conductive layers that are alternately stacked, or a plurality of interlayer insulating layers and a plurality of second sacrificial layers that are alternately stacked;
forming, through the alternately-stacked structure, a pair of second pillars that are connected with the pair of first pillars;
forming, over the pair of second pillars, a source line that is connected with the pair of second pillars and extends in the second direction;
forming drain contacts, over each active region, of the plurality of active regions, at both sides of the pair of drain selection lines except between each drain selection line of the pair of drain selection lines; and
forming, over the drain contacts, a bit line that is connected with the drain contacts and extends in the first direction.

11. The method of fabricating a non-volatile memory device of claim 10, wherein the forming the plurality of active regions comprises:
forming a plurality of initial active regions extending in the first direction, by forming isolation trenches in the semiconductor substrate;
forming an isolation layer in a lower portion of each isolation trench;
forming a first sacrificial layer in a portion of each isolation trench that is not filled with the isolation layer;
forming the pair of first pillars by etching an upper portion of each initial active region of the plurality of initial active regions; and
removing the first sacrificial layer.

12. The method of fabricating a non-volatile memory device of claim 10, wherein the forming the drain selection lines comprises:
forming a conductive material along a resultant structure, including the plurality of active regions and the pair of first pillars;
performing an etchback so that the conductive material formed on a side of each first pillar, of the pair of first pillars, is isolated;
forming an insulating material over a resultant structure of the etchback; and
planarizing the resultant structure of the etchback to expose upper surfaces of the first pillars.

13. The method of fabricating a non-volatile memory device of claim 10, further comprising:
forming, before the forming the drain selection lines, a gate insulating layer, interposed between each drain selection line and each first pillar, via a thermal oxidation process.

14. The method of fabricating a non-volatile memory device of claim 10, further comprising:
after the forming the pair of second pillars,
patterning the alternately-stacked structure so that the alternately-stacked structure is isolated for each source line etching layers exposed by the patterned alternately-stacked structure until each active region, of the plurality of active regions, is exposed; and forming drain regions and source regions by implanting ions into the exposed active regions and into upper ends of the second pillars.

15. The method of fabricating a non-volatile memory device of claim 10, further comprising:

before the forming a source line, forming a source contact over each second pillar of the pair of second pillars, and wherein the forming the drain contacts comprises:

forming a first drain contact together with the source contact; and forming a second drain contact that is disposed over the first drain contact after the forming the source line.

16. The method of fabricating a non-volatile memory device of claim 10, further comprising:

after the forming the pair of second pillars, patterning the alternately-stacked structure so that the alternately-stacked structure is isolated for each source line;

removing the plurality of second sacrificial layers exposed by the patterning of the alternately-stacked structure; and filling a space, formed by the removal of each second sacrificial layer, with a conductive material.

17. A non-volatile memory device comprising:

a semiconductor substrate including an active region having a first pillar that protrudes from the active region;

a drain selection gate surrounding the first pillar;

a second pillar disposed over the first pillar, and formed of a semiconductor material;

a plurality of memory cell gates and a source selection gate stacked along a length of the second pillar and surrounding the second pillar;

a source line formed over and connected with the second pillar; and a bit line disposed over the second pillar, and connected with the active region at one side of the drain selection gate through a drain contact.

18. The non-volatile memory device of claim 17, wherein the active region and the first pillar are formed of a P-type semiconductor.

19. The non-volatile memory device of claim 17, wherein the active region and the first pillar are formed of a single-crystal semiconductor.

20. The non-volatile memory device of claim 18, wherein an erase operation is performed in an F-N tunneling manner by applying an erase voltage to the semiconductor substrate.

21. The non-volatile memory device of claim 17, further comprising:

a drain region formed in the active region at one side of the drain selection gate; and a source region formed in an upper end of the second pillar.

22. The non-volatile memory device of claim 17, wherein the source line is directly connected with the second pillar or is connected with the second pillar through a source contact interposed between the source line and the second pillar.

* * * * *

UNITED STATES PATENT AND TRADEMARK OFFICE
CERTIFICATE OF CORRECTION

PATENT NO.         : 8,923,072 B2
APPLICATION NO.    : 13/832793
DATED              : December 30, 2014
INVENTOR(S)        : Seul-Ki Oh Page 1 of 1

It is certified that error appears in the above-identified patent and that said Letters Patent is hereby corrected as shown below:

On the title page

Insert item 30 the Foreign Application Priority Data section as follows:

--Foreign Application Priority Data

December 17, 2012     (KR).............................. 10-2012-0147365--

Correct item 56 the References Cited section as follows:

FOREIGN PATENT DOCUMENTS

KR           1020120012728         2/2012

Signed and Sealed this
Second Day of February, 2016

Michelle K. Lee
*Director of the United States Patent and Trademark Office*